(12) United States Patent
Walter et al.

(10) Patent No.: US 9,012,940 B2
(45) Date of Patent: Apr. 21, 2015

(54) OPTOELECTRONIC SEMICONDUCTOR BODIES HAVING A REFLECTIVE LAYER SYSTEM

(75) Inventors: Robert Walter, Parsberg (DE); Vincent Grolier, München (DE); Michael Schmal, Schmidmühlen (DE); Korbinian Perzlmaier, Regensburg (DE); Franz Eberhard, Regensburg (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 742 days.

(21) Appl. No.: 13/255,341

(22) PCT Filed: Apr. 26, 2010

(86) PCT No.: PCT/EP2010/055546
§ 371 (c)(1),
(2), (4) Date: Nov. 16, 2011

(87) PCT Pub. No.: WO2010/125028
PCT Pub. Date: Nov. 4, 2010

(65) Prior Publication Data
US 2012/0049228 A1 Mar. 1, 2012

(30) Foreign Application Priority Data
Apr. 30, 2009 (DE) .......................... 10 2009 019 524

(51) Int. Cl.
*H01L 33/10* (2010.01)
*H01L 31/0216* (2014.01)
(Continued)

(52) U.S. Cl.
CPC ...... *H01L 31/02161* (2013.01); *H01L 31/0232* (2013.01); *H01L 33/46* (2013.01); *H01S 5/18369* (2013.01)

(58) Field of Classification Search
CPC .................. H01L 31/02161; H01L 31/0232
USPC ........................ 257/79, 98, E33.072
See application file for complete search history.

(56) References Cited

U.S. PATENT DOCUMENTS 8,076,686 B2 * 12/2011 Yu et al. .......................... 257/98
2005/0008879 A1   1/2005 Shin et al.
(Continued)

FOREIGN PATENT DOCUMENTS

CN   101278412   10/2008
CN   100442557   12/2008
(Continued)

OTHER PUBLICATIONS

Kim, et al. "GaInN light-emitting diodes with RuO2/SiO2/Ag omnidirectional reflector" *Applied Physics Letters*, vol. 84, No. 22 (2004) pp. 4508-4510.
(Continued)

*Primary Examiner* — Jose R Diaz
(74) *Attorney, Agent, or Firm* — Occhiuti & Rohlicek LLP

(57) ABSTRACT

An optoelectronic semiconductor body (1) having an active semiconductor layer sequence (10) and a reflective layer system (20) is described. The reflective layer system (20) comprises a first radiation-permeable layer (21), which adjoins the semiconductor layer sequence (10), and a metal layer (23) on the side of the first radiation-permeable layer (21) facing away from the semiconductor layer sequence (10). The first radiation-permeable layer (21) contains a first dielectric material. Between the first radiation-permeable layer (21) and the metal layer (23) there is disposed a second radiation-permeable layer (22) which contains an adhesion-improving material. The metal layer (23) is applied directly to the adhesion-improving material. The adhesion-improving material differs from the first dielectric material and is selected such that the adhesion of the metal layer (23) is improved in comparison with the adhesion on the first dielectric material.

11 Claims, 1 Drawing Sheet

Figure 1:
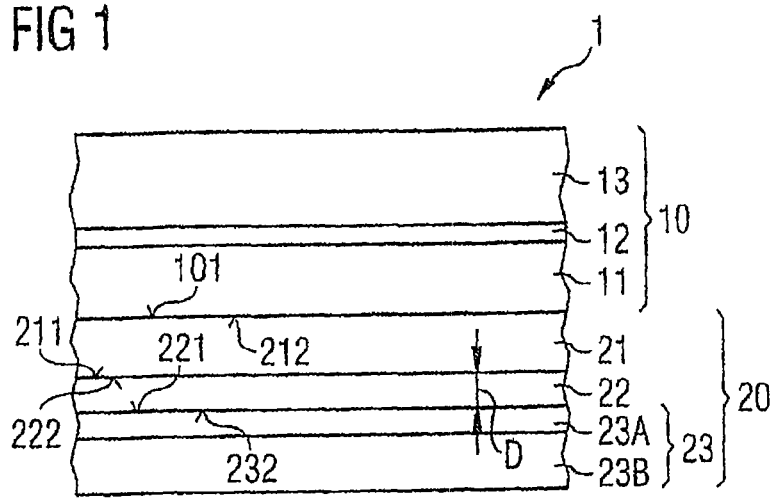

(51) Int. Cl.
   *H01L 31/0232* (2014.01)
   *H01L 33/46* (2010.01)
   *H01S 5/183* (2006.01)

(56) References Cited

U.S. PATENT DOCUMENTS

| | | |
|---|---|---|
| 2006/0083280 A1 | 4/2006 | Tauzin et al. |
| 2008/0290356 A1 | 11/2008 | Krauter et al. |
| 2009/0141224 A1 | 6/2009 | Ito et al. |
| 2010/0117111 A1 | 5/2010 | Illek et al. |
| 2010/0171135 A1 | 7/2010 | Engl et al. |
| 2010/0208763 A1 | 8/2010 | Engl et al. |
| 2010/0230698 A1 | 9/2010 | Rode et al. |

FOREIGN PATENT DOCUMENTS

| | | |
|---|---|---|
| DE | 19640240 | 4/1998 |
| DE | 102004040277 | 2/2006 |
| DE | 102006030094 | 8/2007 |
| DE | 102007019776 | 10/2008 |
| DE | 102007029370 | 11/2008 |
| DE | 102007043181 | 3/2009 |
| DE | 102008021403 | 4/2009 |
| EP | 1650795 | 4/2006 |
| JP | 60-254750 | 12/1985 |
| JP | 2006120913 | 5/2006 |
| JP | 2007258276 | 10/2007 |
| JP | 2008277651 | 11/2008 |
| JP | 2009088299 | 4/2009 |
| TW | 200849677 | 12/2008 |
| WO | 01/75486 | 10/2001 |
| WO | WO 2008/119899 | 10/2008 |
| WO | 2008/131735 | 11/2008 |
| WO | 2009/010762 | 1/2009 |

OTHER PUBLICATIONS

Third Office Action, Chinese Application No. 201080018792.5, mailed Sep. 29, 2014 (9 pages).

* cited by examiner

OPTOELECTRONIC SEMICONDUCTOR BODIES HAVING A REFLECTIVE LAYER SYSTEM

CROSS-REFERENCE TO RELATED APPLICATIONS

This application is the National Stage of International Application No. PCT/EP2010/055546, filed on Apr. 26, 2010, which claims the priority of German Patent Application No. 10 2009 019 524.6, filed on Apr. 30, 2009. The contents of both applications are hereby incorporated by reference in their entirety.

The present application relates to an optoelectronic semiconductor body having a reflective layer system.

It is an object of the present application to provide an optoelectronic semiconductor body having a reflective layer system which contains a radiation-permeable layer and a metal layer, wherein the risk of delamination of the metal layer is reduced.

This object is achieved by the optoelectronic semiconductor body having the features of claim 1. Advantageous embodiments and developments of the semiconductor body are described in the dependent claims, the disclosure content of which is hereby expressly incorporated into the description.

An optoelectronic semiconductor body is provided. The semiconductor body comprises an active semiconductor layer sequence. The active semiconductor layer sequence expediently contains an n-conductive layer, a p-conductive layer and an active layer between the n-conductive layer and the p-conductive layer. The active layer preferably comprises a pn-junction, a double heterostructure, a single quantum well structure or a multiple quantum well structure for generating radiation. The active semiconductor layer sequence is provided preferably for the emission of electromagnetic radiation—in particular in the infrared, visible and/or ultraviolet spectral range. Alternatively or in addition, the active semiconductor layer sequence can also be provided for the reception of electromagnetic radiation. The active semiconductor layer sequence is preferably an epitaxial layer sequence which is, for example, epitaxially deposited on a growth substrate, wherein the growth substrate can be subsequently removed or thinned to a significant extent.

In addition, the optoelectronic semiconductor body comprises a reflective layer system. The reflective layer system contains a first radiation-permeable layer which adjoins the active semiconductor layer sequence. In a preferred embodiment, the first radiation-permeable layer contains a dielectric material, in particular silicon dioxide ($SiO_2$).

In the present context the term "radiation-permeable layer" refers to a layer which consists of a material composition which is at least partially permeable, and in particular transparent, for electromagnetic radiation, for the emission or reception of which the active semiconductor layer sequence is provided. In one embodiment, the first radiation-permeable layer contains a distributed Bragg reflector (DBR) which contains e.g. several layer pairs each having an $SiO_2$ layer and a $TiO_2$ layer.

Moreover, the reflective layer system contains a metal layer which follows the first radiation-permeable layer in the direction away from the semiconductor layer sequence. In other words, the metal layer is disposed on the side of the first radiation-permeable layer facing away from the semiconductor layer sequence.

Disposed between the first radiation-permeable layer and the metal layer is a second radiation-permeable layer. The second radiation-permeable layer contains an adhesion-improving material or consists of the adhesion-improving material. The metal layer is applied directly to the adhesion-improving material of the second radiation-permeable layer. The adhesion-improving material differs from the first dielectric material. It is selected such that the adhesion of the metal layer is improved in comparison with the adhesion on the first dielectric material.

Adhesion is improved in particular if a tensile force and/or a shear force, which is required in order to separate the metal layer from the adhesion-improving material, is greater than the corresponding tensile force or shear force which is required in order to separate a corresponding metal layer, which is applied directly to the first dielectric material, from this dielectric material.

Such a reflective layer system is advantageous in order to achieve a high degree of reflectivity. For example, light rays which extend in the semiconductor layer sequence at a flat angle towards the reflective layer system are totally reflected on the boundary surface between the semiconductor layer sequence and the first radiation-permeable layer. Light rays which do not fulfill the reflection conditions for total reflection and penetrate into the first radiation-permeable layer are reflected back in the direction of the semiconductor layer sequence e.g. by means of the metal layer. In this manner, a high degree of reflectivity can be achieved over a large angular range.

If the adhesion of the metal layer to that transparent layer of the reflective layer system, which precedes it in the direction towards the semiconductor layer sequence, is inadequate, there is a risk that the component will become unusable, e.g. by reason of a delamination of the metal layer at least in places.

This risk is reduced with the second radiation-permeable layer, by means of which particularly effective adhesion of the metallic layer can be achieved. In particular in the case of mass production of these components it is thus advantageously possible to keep the proportion of deficient and/or unusable components particularly low.

In a preferred embodiment, the adhesion-improving material is a second dielectric material. Expediently, the second dielectric material is different from the first dielectric material. In particular, the second dielectric material is different from silicon dioxide. Silicon dioxide is a dielectric material having particularly disadvantageous adhesion properties for the metal layer.

Preferably, the adhesion-improving material, in particular the second dielectric material, is a nitrogen-containing compound, e.g. aluminum nitride (AlN), a silicon nitride ($Si_xN_y$) such as $Si_3N_4$ or tantalum nitride (TaN). The inventors have established that particularly effective adhesion of the metal layer is achieved by means of a second radiation-permeable layer which contains a nitrogen-containing compound as an adhesion-improving material. The adhesion of metal layers on nitrogen-containing compounds, in particular on $Si_3N_4$, is improved in particular with respect to the adhesion on other dielectric materials, such as silicon dioxide.

In an alternative embodiment, the adhesion-improving material is a transparent conducting oxide (TCO). Preferably, the transparent conducting oxide is indium tungsten oxide (IW), indium zinc oxide (IZO) or zinc oxide (ZnO). The inventors have established that particularly effective adhesion of the metal layer is achieved e.g. by means of zinc oxide. Other transparent conducting oxides, such as indium tin oxide (ITO) also have an adhesion which is improved compared to silicon dioxide. However, in an advantageous manner the adhesion properties of zinc oxide are even further improved compared to these other transparent conducting oxides.

In one embodiment, the second radiation-permeable layer has a layer thickness of 100 nm or less. Preferably, it has a layer thickness of ten nanometers or less. In an advantageous manner, in the case of such a layer thickness the absorption losses due to the second radiation-permeable layer are particularly small. Such a small layer thickness is advantageous particularly in the case of transparent conducting oxides as the adhesion-improving material, since in comparative terms they are greatly absorbent.

In another embodiment, the second radiation-permeable layer comprises a layer system consisting of layer pairs having an alternately high and low refractive index. This type of layer system constitutes e.g. a distributed Bragg reflector. Such distributed Bragg reflectors are known in principle to the person skilled in the art and therefore will not be explained in greater detail at this juncture. In the case of the present distributed Bragg reflector, one layer pair, a plurality of layer pairs or each layer pair contains a layer which consists of the adhesion-improving material, in particular of a silicon nitride such as $Si_3N_4$ or zinc oxide. The second layer of the layer pair(s) consists e.g. of silicon dioxide. In this regard, it is important that the distributed Bragg reflector terminates on the side, facing away from the semiconductor layer sequence, with a layer consisting of the adhesion-improving material, to which the metal layer is then directly applied.

In the case of a preferred embodiment, the metal layer comprises a multiple layer structure. The multiple layer structure has an adhesion-promotion layer which faces towards the semiconductor layer sequence and is applied directly to the adhesion-improving material of the second radiation-permeable layer. In the direction away from the semiconductor layer sequence, the adhesion-promotion layer is followed by a reflector layer.

The adhesion-promotion layer contains at least one of the metals from the group formed by Ti, Ta, Al, Pt, Pd, Cr and Ni. For example, it consists of one of these metals or of an alloy of these metals. Preferably, the adhesion-promotion layer has a thickness of 50 nanometers or less, particularly preferably one nanometer or less.

The metal layer preferably contains one of the following metals or consists of one of these metals: Al, Ag, Au. Preferably, this/these metal(s) is/are contained in the reflector layer. The reflector layer preferably adjoins the adhesion-promotion layer on the side facing away from the semiconductor layer sequence.

Figure 2:
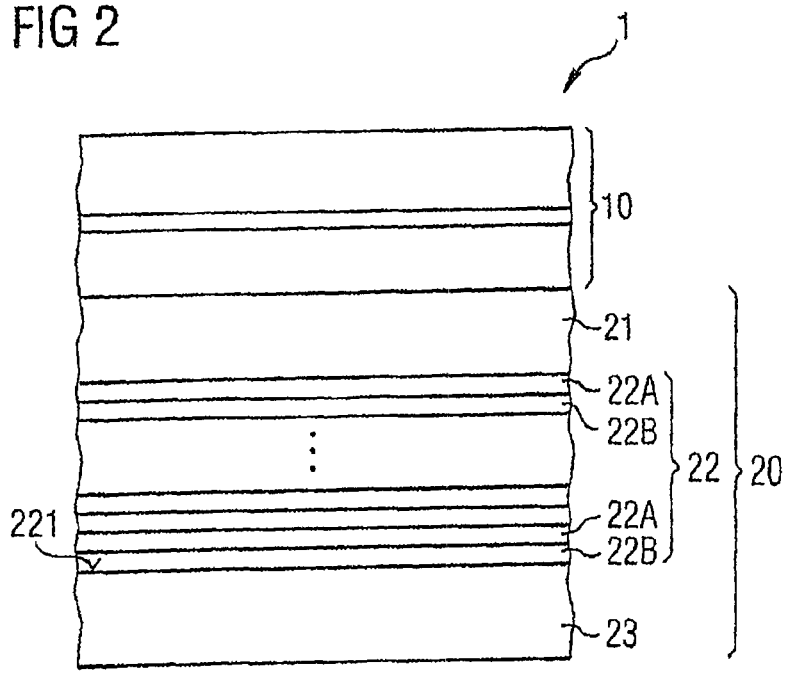

Further advantages and advantageous embodiments and developments are apparent from the following exemplary embodiments described in conjunction with FIGS. 1 and 2, in which:

FIG. 1 shows a schematic cross-sectional view of a semiconductor body in accordance with a first exemplary embodiment, and FIG. 2 shows a schematic cross-sectional view of a semiconductor body in accordance with a second exemplary embodiment.

In the Figures and exemplary embodiments, like components or components which function in a similar manner are designated by the same reference numerals. The Figures and the size ratios of the elements—in particular layers—which are illustrated in the Figures are not to be interpreted as being true to scale. Rather, individual elements can be illustrated to be excessively large—e.g. excessively thick—in order to provide a better understanding and/or better representation.

FIG. 1 illustrates an optoelectronic semiconductor body 1 in accordance with a first exemplary embodiment. The semiconductor body comprises an active semiconductor layer sequence 10. The active semiconductor layer sequence 10 is, for example, grown epitaxially on a growth substrate (not illustrated in the Figures). The growth substrate can be removed or thinned to a significant extent.

The active semiconductor layer sequence 10 contains an n-conductive layer 11, an active layer 12 which contains e.g. a multiple quantum well structure for generating radiation, and a p-conductive layer 13. The sequence of the n-conductive and p-conductive layers 11, 13 can also be interchanged. A reflective layer system 20 is applied to a first main surface 101 of the semiconductor layer sequence 10. In the present case, the reflective layer system 20 consists of a first radiation-permeable layer 21, a second radiation-permeable layer 22 and a metal layer 23.

The second radiation-permeable layer 22 is applied to a first main surface 211 of the first radiation-permeable layer 21. By means of the second main surface 212, which lies opposite the first main surface 211, the first radiation-permeable layer 21 adjoins the first main surface 101 of the semiconductor layer sequence 10. The metal layer 23 is applied to a first main surface 221 of the second radiation-permeable layer 22. The second main surface 222 of the second radiation-permeable layer which lies opposite the first main surface 221 adjoins the first main surface 211 of the first radiation-permeable layer 21.

The first radiation-permeable layer 21 consists e.g. of silicon dioxide ($SiO_2$). In the present case, the second radiation-permeable layer 22 consists of the silicon nitride $Si_3N_4$ and has a layer thickness D of 10 nm or less. In one variant of this exemplary embodiment, the second radiation-permeable layer 22 consists of the transparent conducting oxide ZnO.

In the present case, the metal layer 23 which by means of a main surface 232 adjoins the second radiation-permeable layer 22 consists of an adhesion-promotion layer 23A and a reflector layer 23B. The adhesion-promotion layer 23A is applied directly to the adhesion-improving material—i.e., to the silicon nitride in the present case or to the zinc oxide of the second radiation-permeable layer 22 in the case of the variant of this exemplary embodiment.

The adhesion-promotion layer 23A consists e.g. of chromium (Cr) and/or titanium (Ti). Applied directly to the adhesion-promotion layer is the reflector layer 23B which in the present case consists of silver (Ag).

FIG. 2 illustrates a second exemplary embodiment of an optoelectronic semiconductor body. The optoelectronic semiconductor body 1 in accordance with the second exemplified embodiment differs from that of the first exemplified embodiment in that the second radiation-permeable layer 22 is formed as a distributed Bragg reflector (DBR).

In this exemplary embodiment, the second radiation-permeable layer consists of layer pairs 22A, 22B of layers having an alternately high and low refractive index. For example, the first layers 22A of the layer pairs consist of silicon dioxide which has a refractive index n of about n≈1.45 and the second layers 22B of the layer pairs consist of silicon nitride which has a refractive index n of about n≈2. The DBR comprises e.g. at least five, in particular at least ten, of these layer pairs 22A, 22B.

On the first main surface 221 of the second radiation-permeable layer 22 facing away from the semiconductor layer sequence, the DBR terminates with a silicon nitride layer 22B, to which the metal layer 23 is directly applied.

The invention is not limited to the exemplary embodiments by way of the description with reference thereto. Rather, it includes each new feature and each combination of features in the exemplary embodiments and claims, even if this combination itself is not explicitly stated in the claims or exemplified embodiments.

This patent application claims the priority of the German patent application 102009019524.6, the disclosure content of which is hereby incorporated by reference.

The invention claimed is:

1. Optoelectronic semiconductor body having:
   an active semiconductor layer sequence;
   and a reflective layer system including
      a first radiation-permeable layer adjoining the semiconductor layer sequence; the first radiation-permeable layer including:
         a first dielectric material, and
         a metal layer which is disposed on the side of the first radiation-permeable layer facing away from the semiconductor layer sequence,
      wherein between the first radiation-permeable layer and the metal layer there is disposed a second radiation-permeable layer including an adhesion-improving material, to which the metal layer is directly applied, and the adhesion-improving material differs from the first dielectric material and is selected such that the adhesion of the metal layer on the adhesion-improving material is improved in comparison with the adhesion on the first dielectric material,
      wherein the first radiation-permeable layer consists of silicon dioxide, the second radiation-permeable layer has a layer thickness of 10 nm or less, the second radiation-permeable layer adjoins the first radiation-permeable layer, and the adhesion-improving material is a nitrogen-containing compound and/or transparent conducting oxide.

2. Optoelectronic semiconductor body as claimed in claim 1, wherein the adhesion-improving material is a nitrogen-containing compound.

3. Optoelectronic semiconductor body as claimed in claim 2, wherein the nitrogen-containing compound is selected from the group consisting of AlN, $Si_xN_y$, $Si_3N_4$, TaN.

4. Optoelectronic semiconductor body as claimed in claim 1, wherein the adhesion-improving material is a transparent conducting oxide.

5. Optoelectronic semiconductor body as claimed in claim 4, wherein the adhesion-improving material is indium tungsten oxide, indium zinc oxide or zinc oxide.

6. Optoelectronic semiconductor body as claimed in claim 1, wherein the metal layer comprises a multiple layer structure which contains an adhesion-promotion layer, which faces towards the semiconductor layer sequence and is applied directly to the adhesion-improving material, and a reflector layer on the side of the adhesion-promotion layer facing away from the semiconductor layer sequence.

7. Optoelectronic semiconductor body as claimed in claim 6, wherein the adhesion-promotion layer contains at least one of the following metals or consists of one of these metals: Ti, Ta, Al, Pt, Pd, Cr, Ni.

8. Optoelectronic semiconductor body as claimed in claim 7, wherein the adhesion-promotion layer has a layer thickness of 1 nm or less.

9. Optoelectronic semiconductor body as claimed in claim 1, wherein the metal layer contains at least one of the following metals or consists of one of these metals: Al, Ag, Au.

10. Optoelectronic semiconductor body as claimed in claim 6, wherein the reflector layer contains at least one of the following metals or consists of one of these metals: Al, Ag, Au.

11. Optoelectronic semiconductor body having
    an active semiconductor layer sequence and
    a reflective layer system which comprises a first radiation-permeable layer, which adjoins the semiconductor layer sequence and contains a first dielectric material, and a metal layer which is disposed on the side of the first radiation-permeable layer facing away from the semiconductor layer sequence, wherein,
    between the first radiation-permeable layer and the metal layer there is disposed a second radiation-permeable layer which contains an adhesion-improving material, to which the metal layer is directly applied, and
    the adhesion-improving material differs from the first dielectric material,
    the first radiation-permeable layer is a continuous and contiguous layer without interruptions which covers the whole semiconductor layer sequence,
    the first radiation-permeable layer consists of silicon dioxide,
    the second radiation-permeable layer has a layer thickness of 10 nm or less,
    the adhesion-improving material is a nitrogen-containing compound,
    the nitrogen-containing compound is selected from the group consisting of AlN, SixNy, Si3N4 and TaN; and
    the metal layer comprises a multiple layer structure which contains an adhesion-promotion layer, which faces towards the semiconductor layer sequence and is applied directly to the adhesion-improving material, and a reflector layer on the side of the adhesion-promotion layer facing away from the semiconductor layer sequence.

* * * * *